US006477625B1

United States Patent
Pascucci et al.

(10) Patent No.: US 6,477,625 B1
(45) Date of Patent: Nov. 5, 2002

(54) METHOD AND SYSTEM FOR READING A MEMORY BY APPLYING CONTROL SIGNALS THERETO

(75) Inventors: Luigi Pascucci, Sesto San Giovanni; Marco Fontana, Milan, both of (IT)

(73) Assignee: STMelectronics S.r.l., Agrate Brianza (IT)

(*) Notice: Subject to any disclaimer, the term of this patent is extended or adjusted under 35 U.S.C. 154(b) by 0 days.

(21) Appl. No.: 09/474,932

(22) Filed: Dec. 29, 1999

(30) Foreign Application Priority Data

Dec. 30, 1998 (EP) ............................................. 98830801

(51) Int. Cl.[7] .............................................. G06F 12/06
(52) U.S. Cl. ............................. 711/154; 710/33; 710/38
(58) Field of Search ................................ 326/38; 710/33, 710/74, 11; 711/100, 200, 154

(56) References Cited

U.S. PATENT DOCUMENTS 5,452,261 A   9/1995  Chung et al. ............... 365/233
5,646,545 A * 7/1997  Trimberger et al. ........ 326/38
5,675,549 A * 10/1997 Ong et al. ................ 365/230.02
5,745,409 A   4/1998  Wong et al. ............. 365/185.03

FOREIGN PATENT DOCUMENTS

EP   0849739   6/1998
EP   0854485   7/1998

OTHER PUBLICATIONS

Zwie Amitai et al: "Burst Mode Memories Improve Cache Design" Electro International Conference Record, vol. 16, No. 2, Apr. 16, 1991, pp. 279–282, XP000287207.

* cited by examiner

Primary Examiner—B. James Peikari
(74) Attorney, Agent, or Firm—Jenkins & Gilchrist

(57) ABSTRACT

A method for reading a memory by applying control signals. The control signals include a memory enable signal, a visibility signal, and a read signal. By applying the control signals to the memory, the memory is selectively configured into any of a plurality of cycles associated with reading the memory. The different cycles include: random read, pipeline-type random read, sequential read and suspend and wait cycles. Depending upon the cycle configuration of the memory, data is selectively emitted from the memory that coincides with the externally generated address.

32 Claims, 5 Drawing Sheets

| CYCLE | Control Signals | | | ACTION |
|---|---|---|---|---|
| | RD | CE | ALE | |
| Random Read | HL | 0 | 1 | Emission of data at the transition of the RD signal. |
| Pipeline-Type Random Read | HL | 0 | Pulsed High | Emission of data at the transition of the RD signal. |
| Sequential Read | LH | 0 | 0 | Emission of data at the transition of the RD signal. |
| Resume | — | HL | 0 | Emission of data at the transition of the CE signal. |
| Suspend and Wait (state 1) | 1 | 0 | 0 | No data change in output buffers. The datum emission is equal to the previously read datum. |
| Suspend and Wait (state 2) | 1 | LH | 0 | No datum emission. The output buffers are in a tristate condition. |

LH = Low-to-High Transition
HL = High-to-Low Transition

*FIG. 5*

METHOD AND SYSTEM FOR READING A MEMORY BY APPLYING CONTROL SIGNALS THERETO

BACKGROUND OF THE PRESENT INVENTION

1. Field of the Invention

The present invention relates to a method for reading a memory, particularly a non-volatile memory. More particularly, the invention relates to a particular read protocol.

2. Description of the Related Art

It is known that in a conventional memory, particularly of the non-volatile type, a read method that is typically used is a so-called random method, in which word lines and bit lines of the memory are selected randomly and independently. The random method entails read times which are the sum of a sequence of elementary events that can be summarized substantially as follows: (1) selection of word line and bit line paths, (2) bit line pre-charge activity, (3) data evaluation, and (4) propagation for the transfer of the data to an output buffer and transition time of the output buffer.

The total read time of the memory, given by the sum of the times of the individual operations listed above, depends not only on the size of the memory and on its architecture, but also on the type of devices that are present in the memory, i.e., on the technology used.

The advantages of a conventional architecture and read protocol reside in the fact that the architecture provided is simple (minimal-number memory structure), allows easy timing (because the read cycles are all identical), provides maximum efficiency for redundancy structures, and has significantly low consumption of power since the current-absorbing circuits are kept to the smallest possible number. However, the limitation of the conventional architecture and read protocol is indeed the speed at which data can be read (i.e., read speed), which becomes highly important in large memories.

One possible approach for improving the read speed is the use of a page-type read mode, in which a plurality of words in parallel, for example eight, are read during a first cycle. The content of the read operation is stored in a suitable register and the register portion related to the chosen word in a packet of read words is displayed externally (i.e., visible to circuitry external to the memory).

By operating in the page-type read mode, it is possible to scan the words contained in the packet of read words in a significantly shorter time than with a random-type read. However, the first read cycle remains tied to the time required by a random-type read solution.

Page-type read mode reading is in any case affected by some drawbacks, such as: (1) a large number of read circuits (e.g., if eight words in parallel are read and each word contains eight bits, sixty-four sense amplifiers are required); (2) a high current absorption during parallel reading; (3) a need for word registers; (4) a need for register decoding; (5) a reduction in the effectiveness of the redundancy structures, meaning that one line at a time can be replaced with a redundancy line, but in the case of a multiple read, the possibilities of a fault on a line increase, while there is still only one redundancy line available; and (6) a read protocol which provides for a dual cycle time to include random and page read modes.

FIG. 1 illustrates a conventional memory read protocol showing the characteristic of fully stimulating all the selection paths within the memory device from the start of each read and then continuing with the development of the read cycle until external transfer of the read data is achieved. The signal designated by CE indicates chip enabling, while the signal designated by OE indicates data output enabling. The reference signs A0–A15 designate the address transitions and the read cycle time t_cy is defined between one transition and the next.

Limitation of the data Q0–Q15 occurs at a time t_CE after the falling edge of the signal CE, at a time t_OE after the falling edge of the signal OE, and at a time t_ADD after the address transition of the addresses A0–A15. The known read cycle timing also entails the drawback that reading occurs exclusively when a new read cycle begins, since the memory location to which the next read activity is to be targeted is otherwise unknown. The known read cycle timing ensures that every read operation requires a long time, since the read cycle time is, as mentioned, the sum of all the elementary events.

SUMMARY OF THE INVENTION

A more complete appreciation of the present invention and the scope thereof can be obtained from the accompanying drawings which are briefly summarized below, the following detailed description of the presently-preferred embodiments of the invention, and the appended claims.

The present invention includes a method for reading a memory by applying control signals. The control signals include a memory enable signal, a visibility signal, and a read signal. The visibility signal provides the allowability of the memory to utilize an externally generated address that points to a memory location internal to the memory. By applying the control signals to the memory, the memory is configured into any of a plurality of cycles associated with reading the memory. The different cycles include: random read, pipeline-type random read, sequential read, and suspend and wait cycles. Depending upon the configured cycle, data that coincides with the externally generated address is selectively emitted and/or outputted from the memory.

BRIEF DESCRIPTION OF THE DRAWINGS

A more complete understanding of the method and apparatus of the present invention may be obtained by reference to the following Detailed Description when taken in conjunction with the accompanying Drawings wherein:

FIG. 5 is a table that summarizes the different cycles available according to the present invention.

DETAILED DESCRIPTION OF THE PRESENTLY PREFERRED EXEMPLARY EMBODIMENTS

The present invention will now be described more fully hereinafter with reference to the accompanying drawings, in which preferred embodiments of the present invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
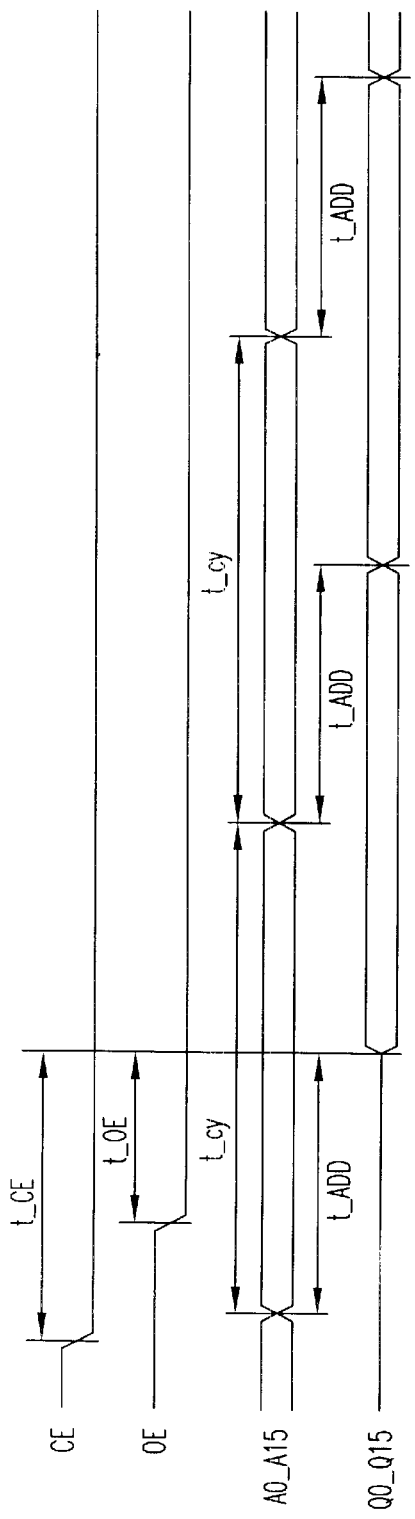
FIG. 1 is a timing diagram of memory read signals according to a known read protocol for a non-volatile memory read operation.
Figure 2:
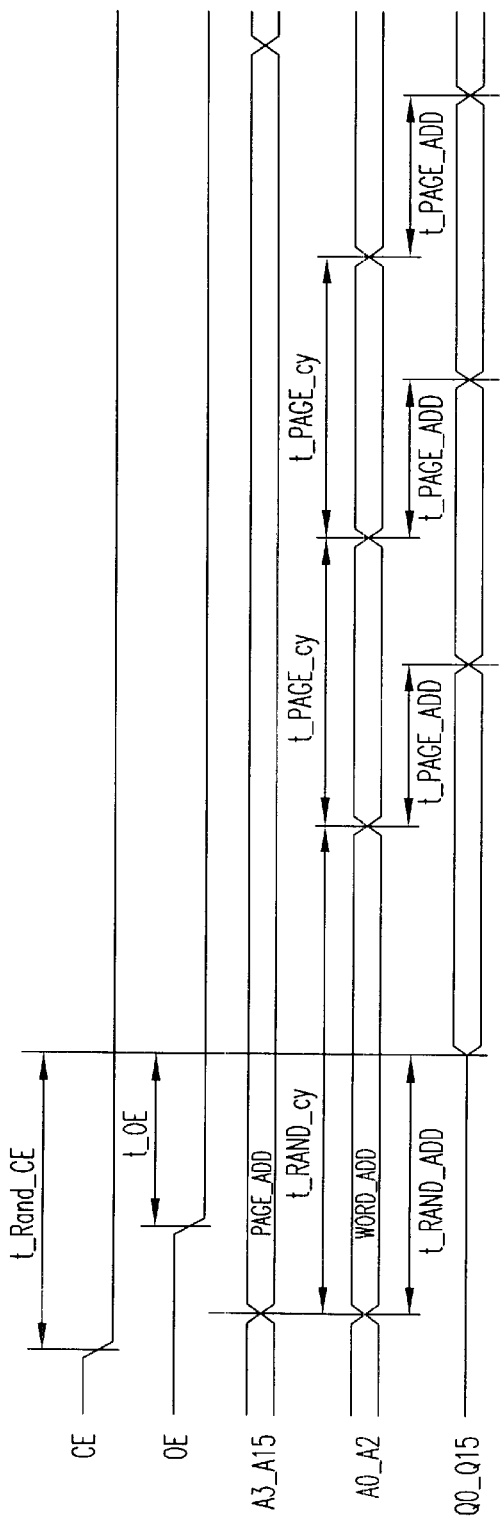
FIG. 2 is a timing diagram of memory read signals according to another known read protocol for a non-volatile memory read operation.

FIG. 1 is a timing diagram of a known random read protocol, while FIG. 2 is a read timing diagram of a known page-type read protocol. Since FIG. 1 has already been described, it is not discussed further herein, and the same applies to FIG. 2, in which the conventional page-type read cycle s assumed to be self-explanatory.

Figure 3:
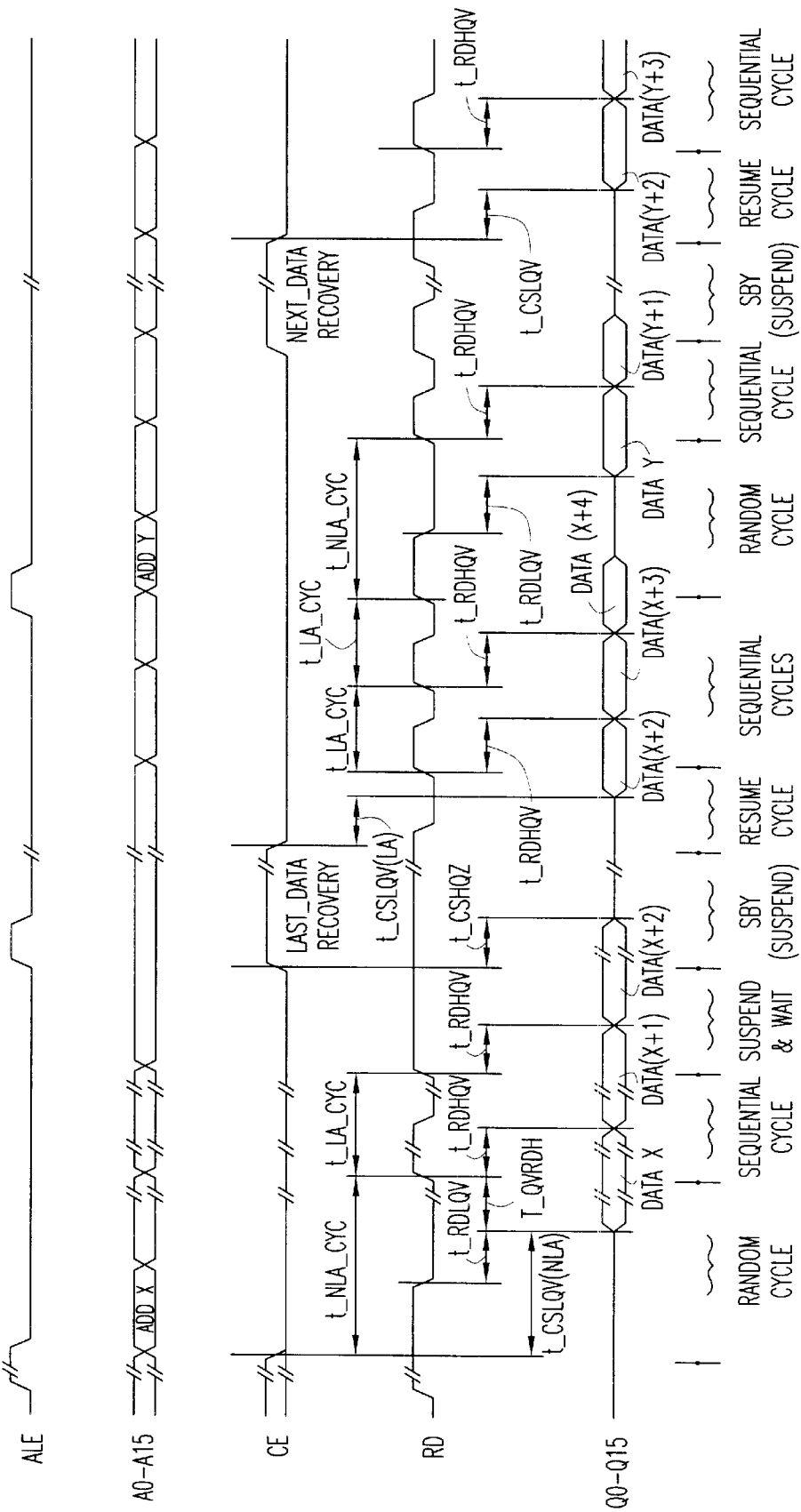
FIG. 3 is a timing diagram of memory read signals of a non-volatile memory read operation according to one method of the present invention.

Accordingly with reference to FIGS. 3 and 4, and particularly initially to FIG. 3, the method for reading a memory, particularly a non-volatile memory, according to the present invention is as follows.

Appropriate memory control signals are defined as follows:

Signal CE is a memory enable signal. The CE signal indicates the suspended state (in the case shown in the figures, with transition of the CE signal from a low-to-high logic level) or the active state of the memory (in the case shown in the figures, with transition of the CE signal from a high-to-low logic level).

Signal ALE is a signal for visibility, inside the memory, of an address generated externally from the memory that is modified for pointing to an internal location of the memory. In other words, the signal for visibility (visibility signal) is indicative of the allowability of the memory to utilize the externally generated address to access the memory location pointed to by the externally generated address. Thus, the internal and external addresses will always concide, momentarily concide, or are unrelated based on the logic of the visibility signal, as will be described hereinablow. If the ALE signal is in a high logic level steady state as in FIG. 4, then the external and internal addresses of the memory always coincide. If instead the ALE signal is pulsed as shown in FIG. 3, then the external addresses are captured at the end of the ALE signal pulse and the external and internal addresses coincide only until the first datum has been emitted. At the end of the ALE signal pulse, the addresses are modified internally within the memory to prepare for the subsequent read operation. If the ALE signal is in a low logic level steady state during a time period as shown in FIG. 3, the external addresses are unconnected to the internal addresses and the internal addresses are managed internally within the memory.

Signal RD is a signal for synchronous advancement of the memory. In a transition from a low-to-high logic level of the RD signal, the data and the address are updated in a sequential or linear memory cycle as described hereinafter. In a transition from a high-to-low logic level of the RD signal, the data and the address are instead updated in a random or nonlinear cycle, which is also described hereinafter.

In addition to the RD signal, the memory has: (1) an address bus, which is variable according to the size of the memory; (2) a data bus, which is also variable according to the number of words in parallel (e.g., 8, 16, 32); and (3) a further control signal, which uses conventional programming voltages, allows to manage the various programming activities.

Based upon the states of the ALE and RD signals, which are control signals, a plurality of read cycles may be defined which differ from each other in terms of read time and read mode. These cycles according to the present invention are defined as follows.

A random read cycle is a read cycle with a random address that correlates an externally generated address to an internal address of the memory. At the end of the random read cycle, the internal address of the memory remains unchanged and coincides with the externally generated address. The random read cycle is identified by the ALE signal being high. Also defining the random read cycle is a read operation performed at a location that is pointed to directly by an externally generated address in a continued manner (i.e., the ALE signal is always a high logic level in the random read cycle).

A suspend and wait cycle (or Sby suspended condition) is performed when no data read activity is required. The suspend and wait cycle is created by a transition from a low-to-high logic level of the CE signal. Also defining the suspend and wait cycle is a mode which allows the memory to suspend the process for the automatic advancement of the memory, remaining on the same location indefinitely. Such a cycle is useful when, for example, the controlling unit (the microprocessor that drives the memory) requires a long processing time.

A pipeline-type random read cycle is defined as a read cycle with a random addressing that correlates an externally generated address to an internal address of the memory that is immediately updated inside the memory (independently of the externally generated address) at the end of the extraction of the datum from the memory. The pipeline-type random read cycle is identified by the ALE signal being pulsed high. Also defining the pipeline-type random read is a reading operation performed at a location in the memory that is pointed to directly by an externally generated address only at the beginning of a read cycle (i.e., the ALE signal is pulsed at the beginning of the read operation).

After the extraction of the first datum, designated by Q0–Q15 in each of the figures, the memory updates its internal address and assumes a sequential read configuration. If a transition of the CE signal from a low-to-high logic level sets the memory to a suspend and wait cycle after the transition of the output buffers (RD=0), there is a read activity for the datum related to the location (n+1), i.e., to retrieve the datum that follows the previously read datum.

A sequential read cycle is defined as a read cycle with an addressing that is successive to the addressing for a previously completed read cycle. Using the sequential read cycle, it is possible to scan the entire memory without having the limitations set by the known page-mode read cycle as previously discussed. If the CE signal transitions from a low-to-high logic level to set the memory to a suspend and wait cycle after the output buffers transition and the RD signal is a low logic level (i.e., equal to 0), reading of the datum related to the next location in memory (n+1) occurs, i.e., a sequential read of the data designated in FIG. 3 by x, x+1, x+2, x+3, x+4, or y, y+1, y+2, y+3 is performed. In this case, the sequential read cycle allows the memory to be internally scanned or accessed by stepping from one memory location to the next. Also defining the sequential read cycle is a reading operation performed at a location pointed to by an internal addressing system that is capable of calculating, in each instance and "synchronously" with the RD signal (acting as a clock), the new address at a location that directly follows the current memory location being accessed. In the sequential mode, the ALE signal is kept low and external address data is ignored by the memory.

A resume cycle is defined as a cycle produced by a high-to-low logic level transition of the CE signal (i.e., the memory resumes its activity, performing a read in which the datum is read from the point that the suspended condition was previously entered due to a low-to-high logic level transition of the CE signal). Also defining the resume cycle is a read cycle performed when returning from a suspend and wait cycle performed at the next memory location (n+1) after the last read performed before the suspended condition occurred (determined by the signal CE=1). In the resume cycle, the ALE signal is kept at a low logic level and the reading operation, on return from the suspend and wait cycle, is enabled at the transition of the CE signal from a high-to-low logic level.

Finally, a suspend and wait cycle is defined as a cycle in which any process for reading and updating an internal address of the memory is suspended. There are two suspend and wait cycles (i.e., two states). A first suspend and wait cycle (state 1) is configured by the CE signal and the ALE signal being a low logic level steady state, whereupon no data change occurs in the output buffers. A second suspend and wait cycle (state 2) is configured by a transition of the CE signal from a low-to-high logic state and the ALE signal being a low logic level steady state, whereupon the output buffers are placed in a tri-state condition and no data emission occurs from the output buffers.

Certain notable features of the present invention are the following: (1) there is no switching on the output buffers in the two types of random read cycles, i.e., the normal random read cycle and the pipeline-type random read cycle, (2) there is no updating of the internal address in the sequential cycle, and (3) if a transition from a low-to-high logic level of the CE signal places the memory in the suspend and wait cycle, the datum related to the next memory location (n+1) is not recovered and the datum for any resume cycle is related to the memory location (n).

Figure 4:
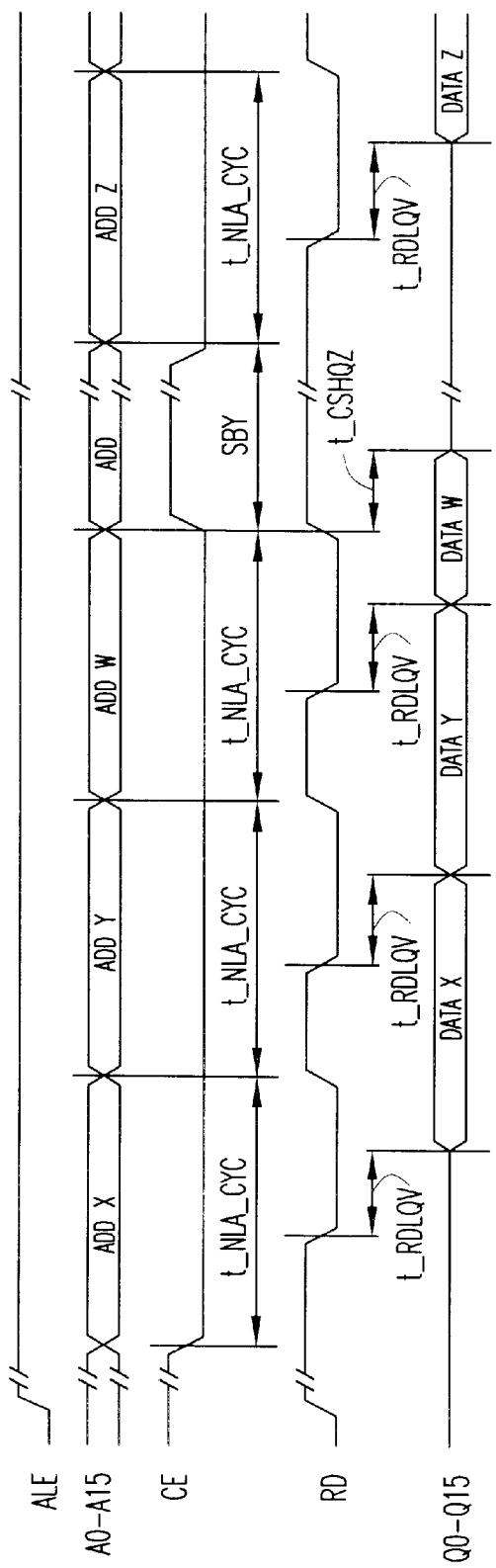
FIG. 4 is a timing diagram of read signals of a non-volatile memory read operation, illustrating another embodiment of the present invention.

FIG. 4 shows a timing diagram of memory read cycles in which the externally generated addresses and internal addresses always coincide due to the ALE signal being in a high logic level steady state. The ALE signal being in a high logic level steady state causes the memory to be in a random read cycle. As shown, for each externally generated address (e.g., ADD X, ADD Y, ADD W, and ADD Z), data stored in internal memory locations corresponding to the externally generated addresses (e.g., DATA X, DATA Y, DATA W, and DATA Z) is output from the memory upon the read cycle upon the clock cycle following the memory receiving the externally generated address.

FIG. 5 shows a summary of the different cycles available with the present invention. The summary shown in FIG. 5 is self-explanatory and encapsulates the description of the different cycles hereinabove.

Figure 6:
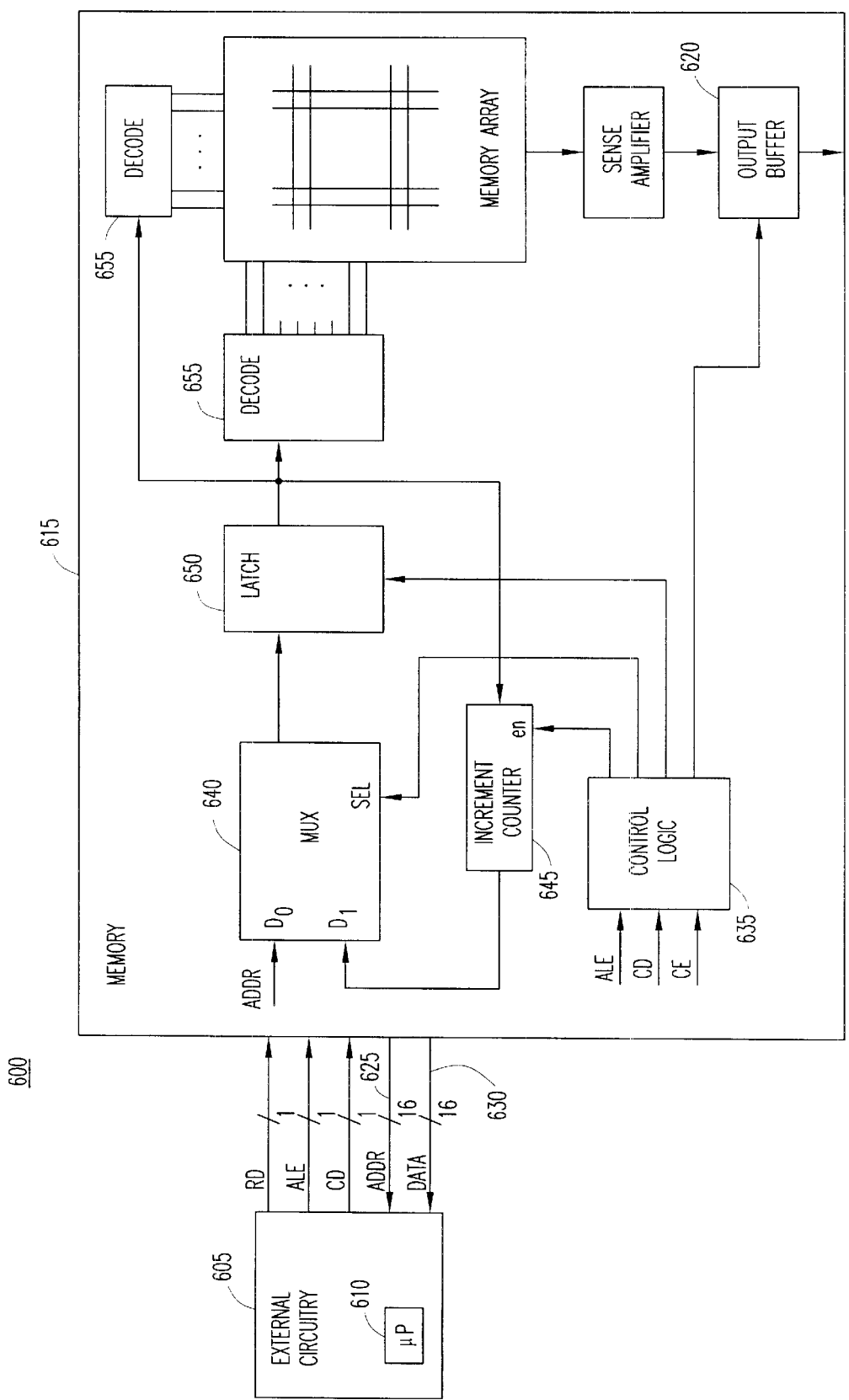
FIG. 6 is a block diagram of a memory device according to an embodiment the present invention.

FIG. 6 is an exemplary block diagram of a hardware configuration 600 that utilizes an embodiment of the present invention. External circuitry 605, including a microprocessor 610, is electrically connected to a memory 615 for storing data. Output buffers 620 for storing and transferring data from the memory 615 to the external circuitry 605 is also included in memory 615.

Control lines RD, ALE, and CE electrically connect the external circuitry 605 and the memory 615 and are input signals to the memory 615 for generating the cycles as previously described herein. An address bus 625 carries externally generated addresses to the memory 615 for reading and writing to the memory 615. The data bus 630 carries data between the external circuitry 605 and the memory 615. The microprocessor 610 generates the control signals (i.e., RD, ALE, and CE) to execute the cycles affecting the memory 615 according to the present invention as described hereinabove.

Control circuitry 635, which may include software in an alternate embodiment, receives the control signals and configures the memory 615 to execute the cycles. It should be understood that the memory 615 comprise circuitry, such as a latch 650 for maintaining the internal address applied to address decoders 655, increment counter 645 for generating an address value that is one greater than the internal address maintained in latch 650, multiplexing circuitry 640 which provides latch 650 with an address corresponding to the external address or the output of increment counter 645; and control logic 635 which controls the operation of circuitry within memory 615, including latch 650, increment counter 645 and multiplexing circuitry 640. Control logic 635 receives controls signals ALE, RD and CE and controls the operation of such circuitry within memory 615 so that memory 615 is configurable to selectively perform any of the read cycles described above.

The read method with the associated execution protocol organizes the memory so as to optimize its response. For example, it is possible to implement a single matrix with the pipeline-type random read cycle that advantageously uses the intervals between output switching and the end of the pipeline-type random read cycle, thereby facilitating the subsequent read cycle if performed at the next memory location. If two separate memory banks are subsequently read, two read processes are started in parallel which, when read simultaneously or alternately, and in a suitable synchronized manner, reduce propagation times by up to fifty-percent. Starting two read cycles on two memory banks, whose successive memory locations belong to different memory banks, considerably reduces datum extraction times because all the preparatory steps (i.e., selection and pre-charging of the paths, configuration settings, etc.) occur during the first read cycle so as to reserve a time interval only for data transfer.

The present invention increases the number of read modes of a non-volatile memory cell and, by configuring the control signals in more convenient and efficient sequences, considerably improves the read performance of the memory. It is important to stress that there is no limit to the number of successive read operations, so that it is possible to read the memory by scanning it entirely sequentially, with a considerable time saving. Moreover, if a reading operation is suspended (i.e., the memory enters a suspend and wait cycle), it is possible to resume the reading operation without any time loss from the point where the reading operation was interrupted.

The previous description is of a preferred embodiment for implementing the invention, and the scope of the invention should not necessarily be limited by this description. The scope of the present invention is instead defined by the following claims.

What is claimed is:

1. A method for reading a memory comprising the steps of:

receiving a memory enable signal;

receiving a visibility signal indicative of the allowability of said memory to utilize address signals generated externally to said memory, said address signals pointing to addresses within said memory;

receiving a read signal to perform a read operation by said memory;

configuring said memory into one of a plurality of cycles associated with reading data from said memory based upon the received memory enable signal, the visibility signal and the read signal, wherein an internal address of said memory is assigned an address value based upon the configured cycle; and selectively emitting said data from at least one memory location in said memory identified by said internal address.

2. The method according to claim 1, wherein said memory is selectively configured to perform a random read cycle during the step of configuring, in which said internal address coincides with said externally generated address and said data read from said memory are emitted during the step of selectively emitting in response to the state transition of said read signal.

3. The method according to claim 2, wherein said state transition of said read signal is a transition from a high logic state to a low logic state.

4. The method according to claim 2, wherein at the end of said random read cycle said address signals generated externally to said memory coincide with said internal address signals of said memory.

5. The method according to claim 1, wherein said memory is selectively configured to perform a pipeline-type random read cycle during the step of configuring, in which said data is read from said memory at a transition of said read signal during the step of selectively emitting.

6. The method according to claim 5, wherein said transition of said read signal is from a high logic state to a low logic state.

7. The method according to claim 6, wherein said pipeline-type random read cycle further comprises said internal address initially corresponding to the externally generated address signals and being incremented after the emission of a first datum during the step of selectively emitting and subsequently thereafter while in said pipeline-type random read cycle.

8. The method according to claim 1, wherein said memory is selectively configured during the step of configuring in a memory resume cycle in which the internal address is incremented to point to a next address relative to an address value previously assigned to the internal address.

9. The method according to claim 1, wherein said memory is selectively configured during the step of configuring to perform a sequential-type read cycle in which the internal address is incremented relative to an address value assigned thereto with each pulse of said read signal, and said data is emitted from said memory location following each pulse of said read signal.

10. The method according to claim 9, wherein said memory is selectively configured in the sequential-type read cycle during said step of configuring following said memory being previously configured in a random-type read cycle.

11. The method according to claim 1, wherein said memory is selectively configured during the step of configuring to perform a memory resume cycle, said internal address being assigned to an address value during said step of configuring that sequentially follows an address in said memory from which said data was immediately emitted therefrom.

12. The method according to claim 11, wherein said memory is selectively configured to perform the memory resume cycle following said memory being disabled.

13. The method according to claim 1, wherein said memory is selectively configured to perform a suspend and wait cycle during said step of configuring in which said internal address maintains an address value previously assigned thereto.

14. The method according to claim 13, wherein:

said memory is disabled during the step of configuring; and said data is not emitted from said memory during the step of emitting.

15. The method according to claim 1, wherein said enable signal, said visibility signal, and said read signal are generated by a microprocessor.

16. The method according to claim 1, further comprising the step of:

selectively switching between cycles based upon the logic state of the received memory enable signal, the visibility signal and the read signal.

17. A method for reading a memory comprising the steps of applying a memory enable signal to enable said memory to read at least one datum therefrom, applying a visibility signal and an external address to said memory, said visibility signal indicative of allowability of said memory to utilize the external address, said external address pointing to an address within said memory;

applying a read signal to said memory to perform a read operation by said memory;

generating an internal address within said memory based upon said visibility signal and said external address; and selectively providing said at least one datum from a memory location in said memory identified by said internal address based upon a state of said read signal.

18. The method according to claim 17, wherein applying said memory enable signal in a low logic steady state provides for said memory to be in at least one of the following cycles: random read, pipeline-type random read, sequential read, and suspend and wait.

19. The method according to claim 17, wherein:

the step of applying the visibility signal and the step of applying the read signal selectively configure said memory in a random read cycle in which the internal address coincides with the externally generated address during the step of generating and said at least one datum is read from the memory location identified by the external address during the step of selectively providing.

20. The method according to claim 17, wherein:

the step of applying the visibility signal applies a pulsed signal to said memory and said step of applying the read signal transitions the read signal between distinct logic levels so that said memory is selectively configured to perform a pipeline-type read cycle in which the internal address coincides with the external address during the step of generating and said at least one datum is read from a memory location identified by the external address during the step of selectively providing only at the beginning of said pipeline-type read cycle.

21. The method according to claim 17, wherein:

the step of applying the visibility signal applies a steady state logic level to said memory, and said step of applying the read signal transitions the read signal between distinct logic levels to selectively configure said memory to be in a sequential read cycle in which said internal address is incremented during said step of generating relative to an address value previously maintained by said internal address.

22. The method according to claim 21, wherein the internal address does not coincide with the external address when said memory is configured in the sequential read cycle.

23. The method according to claim 17, wherein:

the step of applying the visibility signal applies a steady state logic level to said memory and the step of applying the read signal applies a steady state logic level to said memory so as to selectively configure said memory in a suspend and wait cycle to maintain said at least one datum immediately previously read from said memory at an output thereof during said step of selectively providing.

24. The method according to claim 17, wherein:

the step of applying the visibility signal applies a steady state logic level to said memory and the step of applying the memory enable signal applies a steady state logic level to said memory so as to selectively configure the memory to be in a resume cycle to resume emitting said at least one datum from said memory during said step of selectively providing.

25. The method according to claim 17, wherein:

said step of applying the memory enable signal applies a signal that transitions between distinct logic levels and said steps of applying the visibility signal and applying the read signal apply steady state logic levels to said memory so that tri-stated signals are provided during said step of selectively providing.

26. A memory for storing data, said memory comprising:

an array of memory cells; and control circuitry for receiving at least one control signal, selecting an address from one of an externally generated address and an internally generated address based upon said at least one control signal, and providing datum from at least one memory location within said array of memory cells identified by said selected address.

27. The memory according to claim 26, wherein said control circuitry configures said memory into at least one of the following cycles: random read, pipeline-type random read, sequential read, and suspend and wait.

28. The memory according to claim 26, wherein said externally generated address and said internally generated address coincide based upon said at least one control signal.

29. The memory according to claim 26, wherein said externally generated address and said internally generated address do not coincide based upon said at least one control signal.

30. The memory according to claim 26, wherein said at least one control signal includes a visibility signal indicative of allowability of said memory to select the externally generated address.

31. The memory according to claim 26, wherein the control circuit selectively switches said memory to operate in one of a plurality of operating cycles based upon the logic state of three received control signals, said plurality of operating cycles includes a random read cycle, a pipeline-type random read cycle, a sequential read cycle, and a suspend and wait cycle.

32. The method according to claim 31, wherein the plurality of cycles includes a random read cycle, a pipeline random read cycle, a sequential read cycle, a resume cycle, and a suspend and wait cycle.

* * * * *

UNITED STATES PATENT AND TRADEMARK OFFICE
CERTIFICATE OF CORRECTION

PATENT NO.   : 6,477,625 B1
DATED        : November 5, 2002
INVENTOR(S)  : Luigi Pascucci et al.

It is certified that error appears in the above-identified patent and that said Letters Patent is hereby corrected as shown below:

<u>Drawings,</u>
Figure 6, replace "CD" with -- CE --
Figure 6, replace "CD" with -- RD --

<u>Column 3,</u>
Line 13, replace "cycle assumed" with -- cycle is assumed --

<u>Column 8,</u>
Line 12, replace "of" with -- of: --
Line 14, replace "datum therefrom," with -- datum therefrom; --

Signed and Sealed this

Twenty-sixth Day of August, 2003

JAMES E. ROGAN
*Director of the United States Patent and Trademark Office*